United States Patent
Wu et al.

(10) Patent No.: US 7,214,998 B2
(45) Date of Patent: May 8, 2007

(54) COMPLEMENTARY METAL OXIDE SEMICONDUCTOR IMAGE SENSOR LAYOUT STRUCTURE

(75) Inventors: Hsin-Ping Wu, Yilan County (TW); Chia-Huei Lin, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 57 days.

(21) Appl. No.: 11/161,174

(22) Filed: Jul. 26, 2005

(65) Prior Publication Data

US 2007/0023797 A1 Feb. 1, 2007

(51) Int. Cl.
*H01L 31/00* (2006.01)

(52) U.S. Cl. ............... 257/440; 257/292; 257/E27.134; 250/208.1

(58) Field of Classification Search ...................... None
See application file for complete search history.

(56) References Cited

U.S. PATENT DOCUMENTS

| | | | | |
|---|---|---|---|---|
| 6,137,100 | A * | 10/2000 | Fossum et al. | 250/208.1 |
| 6,359,323 | B1 * | 3/2002 | Eom et al. | 257/440 |
| 6,417,002 | B1 | 7/2002 | Horlick et al. | 435/455 |
| 6,455,831 | B1 * | 9/2002 | Bandera et al. | 250/208.1 |
| 6,895,077 | B2 * | 5/2005 | Karellas et al. | 378/98.3 |
| 7,071,980 | B2 * | 7/2006 | Yuki et al. | 348/308 |
| 2002/0051228 | A1 * | 5/2002 | Spears et al. | 358/445 |
| 2003/0169847 | A1 * | 9/2003 | Karellas et al. | 378/98.3 |
| 2004/0100570 | A1 | 5/2004 | Makoto | 348/272 |
| 2004/0159773 | A1 * | 8/2004 | Fein et al. | 250/208.1 |
| 2004/0227822 | A1 * | 11/2004 | Cartilage et al. | 348/207.99 |
| 2005/0045980 | A1 * | 3/2005 | Guidash | 257/432 |
| 2005/0212913 | A1 * | 9/2005 | Richter | 348/170 |
| 2006/0183027 | A1 * | 8/2006 | Lin et al. | 430/5 |

* cited by examiner

*Primary Examiner*—Evan Pert
*Assistant Examiner*—Victor A. Mandala, Jr.
(74) *Attorney, Agent, or Firm*—Jianq Chyun IP Office

(57) ABSTRACT

A complementary metal oxide semiconductor (CMOS) image sensor layout structure is described. The CMOS image sensor layout structure includes a substrate, a plurality of light sensing devices, a plurality of transistors and a plurality of color-filtering film layers. The substrate has a pixel array region comprising a plurality of pixels. Each pixel has a light sensing region and an active device region. The pixels are isolated from one another by isolation structures and the light sensing regions have different sizes. The light sensing devices are defined separately within the respective light sensing regions. The transistors are disposed within the respective active device region. The color-filtering film layers are disposed separately above the pixels to form a color-filtering array.

9 Claims, 3 Drawing Sheets

COMPLEMENTARY METAL OXIDE SEMICONDUCTOR IMAGE SENSOR LAYOUT STRUCTURE

BACKGROUND OF THE INVENTION

1. Field of the Invention

The present invention relates to an image sensor structure. More particularly, the present invention relates to a complementary metal oxide semiconductor (CMOS) image sensor layout structure.

2. Description of the Related Art

The process of forming a complementary metal oxide semiconductor (CMOS) image sensor is compatible to the process of forming a complementary metal oxide semiconductor (CMOS) transistor. Consequently, CMOS image sensors and CMOS transistors can be fabricated with other peripheral circuits on the same chip. Thus, the power consumption and the fabricating cost of image sensors can be significantly reduced. In recent years, many types of CMOS image sensors have gradually replaced charge-coupled devices in the low end of the sensor market and hence its importance is growing every day.

However, CMOS image sensors still have some defects that need to be rectified. For instance, most CMOS image sensors have different sensitivity toward incident light of different frequencies. In particular, the response of CMOS sensor to blue light is slightly inferior to its response to red light and green light.

In U.S. Pat. No. 6,137,100 with the title "CMOS image sensor with different pixel sizes for different colors", a complementary metal oxide semiconductor (CMOS) image sensor having color-filtering film layers of different sizes for resolving the problem of different light sensitivity is disclosed. Furthermore, in U.S. Pub. No. 2004/0100570A1 with the title "Image sensor and digital camera", a method of adjusting the light sensitivity through changing the dimensions of the color-filtering film layer is disclosed. However, the method of changing the size of the color-filtering film layers can be more complicated for the process, and have the disadvantageous question for the production.

SUMMARY OF THE INVENTION

Accordingly, at least one objective of the present invention is to provide a complementary metal oxide semiconductor (CMOS) image sensor layout structure capable of increasing its response to blue light.

In order to achieve these and other advantages and in accordance with the purpose of the invention, as embodied and broadly described herein, the invention provides a complementary metal oxide semiconductor (CMOS) image sensor layout structure. The CMOS image sensor comprises a substrate with a pixel array region. The pixel array region comprises a plurality of pixels each having a light sensing region and an active device region. The pixels are isolated from one another by isolation structures and the light sensing regions have different sizes. The light sensing devices are defined separately within the respective light sensing regions. The transistors are disposed within the respective active device region. The color-filtering film layers are disposed separately above the pixels to form a color-filtering array (CFA).

According to the embodiment of the present invention, the size of each pixel is equivalent.

According to the embodiment of the present invention, the color-filtering array is disposed in such a way to form a Bayer pattern. The Bayer pattern comprising a first color and a second color repeatedly disposed in the odd column of the color-filtering array and a third color and the first color repeatedly disposed in the even column of the color-filtering array. The first color is green, the second color is red and the third color is blue. Furthermore, every four pixels include one red pixel, two green pixels and one blue pixel.

According to the embodiment of the present invention, the size of the light sensing region in each pixel are assigned such that the light sensing region of the blue pixel is greater than that of the green pixel and in turn greater than that of the red pixel.

According to the embodiment of the present invention, the two green pixels use a common active device region.

According to the embodiment of the present invention, the light sensing device comprises a photodiode.

According to the embodiment of the present invention, the CMOS light sensor further comprises a plurality of micro-lenses disposed separately above corresponding color-filtering film layers.

The present invention utilizes a change in the dimensions of the light sensing regions to raise the fill factor (FF) of the pixels and increase the response to blue light. Because the dimensions of the pixels are not modified, there is no increase in the area of occupation of the devices or the cost of fabricating the wafer and lenses. Furthermore, the only modification is the layout design in the very beginning. All subsequent processing steps are identical to the conventional method. Thus, the sensitivity of the device can be significantly increased with very little changes in the fabrication process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
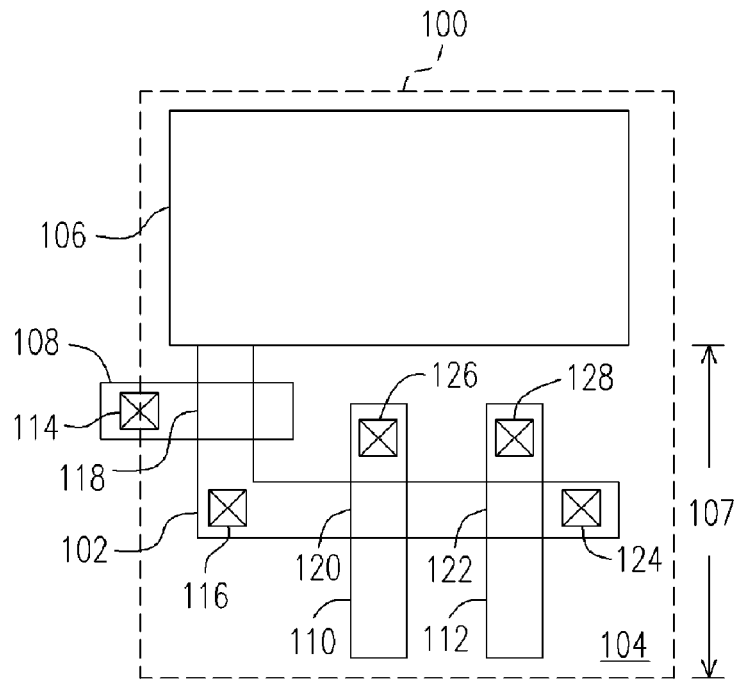
FIG. 1 is a top view of a conventional complementary metal oxide semiconductor (CMOS) image sensor.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view of a conventional complementary metal oxide semiconductor (CMOS) image sensor. As shown in FIG. 1, the complementary metal oxide semiconductor (CMOS) image sensor comprises an array of images sensors which is compose of a plurality of image sensors. Each image sensor 100 includes a photodiode sensing region 106 and a transistor device region 107. The photodiode sensing region 106 and the transistor device region 107 are isolated from each other through an isolation structure 104. The transistor device region 107 includes an active region 102, a conductive layer 108, a conductive layer 110, a conductive layer 112 and a plurality of contacts 114, 116, 124, 126 and 128. The photodiode sensing region 106 is located under a portion of the isolation structure 104. The photodiode sensing region 106 is formed from a doped region having dopants that differ from the substrate and the substrate. That portion of the conductive layer 108 that crosses over the active region 102 serves as the gate of a reset transistor 118. That portion of the conductive layer 110 that crosses over the active region 102 serves as the gate of an output select transistor 120. That portion of the conductive layer 112 that crosses over the active region 102 serves as the gate of a source-coupling transistor 122.

In addition, the area above the image sensor 100 further includes color filters (not shown) for filtering light of three different colors (including red, green and blue).

Figure 2:
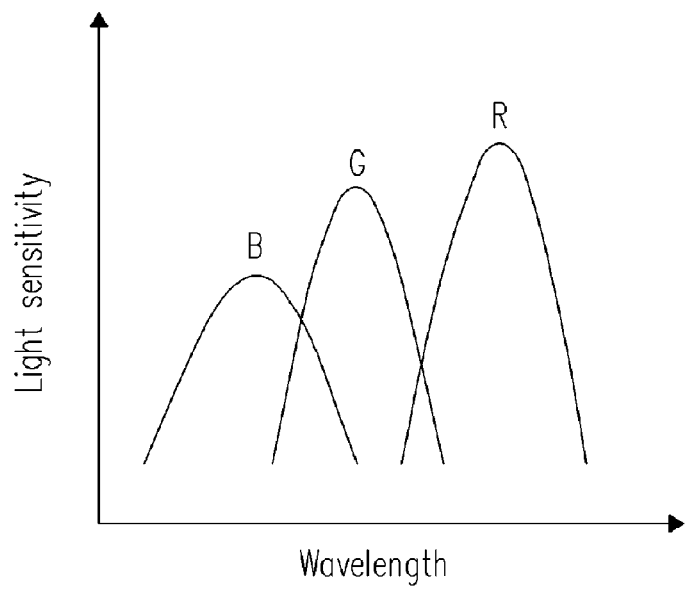
FIG. 2 is a graph showing the sensitivity versus wavelength relation of a conventional CMOS image sensor with respect to red light, green light and blue light.

FIG. 2 is a graph showing the sensitivity versus wavelength relation of a conventional CMOS image sensor with respect to red light, green light and blue light. In FIG. 2, the horizontal axis represents the wavelength (in units of micrometers) and the vertical axis represents the sensitivity of light (arbitrary units) by the sensing device. As shown in FIG. 2, a CMOS image sensor normally has a higher sensing capacity for red light than green light and the sensing capacity for green light is in turn greater than blue light. In other words, the sensing capacity of the CMOS image sensor to blue light is lower than either red light or green light.

Figures 3, 4:
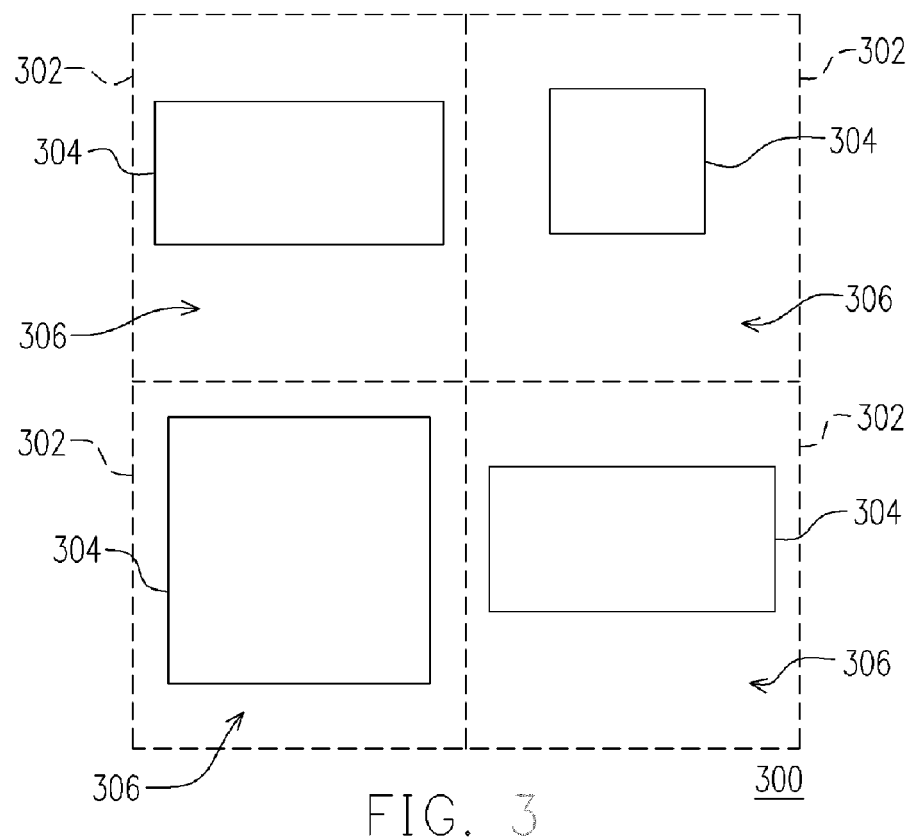
FIG. 3 is a diagram showing a typical pixel layout in a CMOS image sensor according to one embodiment of the present invention.
FIG. 4 is a diagram showing a color-filtering array organized into a Bayer pattern.

Hence, the present invention provides a layout structure for a complementary metal oxide semiconductor (CMOS) image sensor. FIG. 3 is a diagram showing a typical pixel layout in a CMOS image sensor according to one embodiment of the present invention. In the following, a 2×2 pixel array is used as an example in the illustration.

As shown in FIG. 3, the CMOS image sensor mainly comprises a substrate 300 such as a P-type silicon substrate, for example. The substrate 300 has a pixel array region with a plurality of pixels 302 thereon, and the size of each pixel 302 is equivalent. Each pixel 302 has a light sensing region 304 and an active device region 306. Furthermore, each adjacent pair of pixels 302 is isolated from each other by an isolation structure (not shown). The isolation structure can be a field oxide layer, for example. Aside from the light sensing region 304, the remaining area within the pixel 302 can serve as the active device region 306.

The CMOS image sensor further comprises a plurality of light sensing devices defined in the respective light sensing regions 304 and a plurality of transistors disposed in the respective device active regions 306. The light sensing devices are photodiodes, for example. Each photodiode may comprise an N-doped region and a portion of the substrate 300. The transistor can be a reset transistor, an output select transistor or a source-coupling transistor, for example.

It should be noted that, the size of each pixel 302 is equivalent, and the light sensing regions 304 in the present invention have different dimensions. In general, the area of the light sensing region will affect the sensing capacity of the pixel. Similarly, the area ratio between the area of the light sensing region 304 and the area of the pixel 302 is a major factor affecting the sensing capacity of the pixel. The area of the light sensing region divided by the pixel area can be defined as the fill factor (FF). In other words, the higher the fill factor within the pixel, the higher will be the sensitivity of the pixel.

In addition, a color-filtering array (CFA) (not shown) is also disposed over corresponding pixel array region. In other words, there is a color-filtering film layer over a corresponding pixel 302. The color-filtering array is organized into a Bayer pattern. The Bayer pattern includes a first color and a second color repeatedly disposed in the odd column of the color-filtering array and a third color and the first color repeatedly disposed in the even column of the color-filtering array. The first color is green, the second color is red and the third color is blue. FIG. 4 is a diagram showing a color-filtering array organized into a Bayer pattern. As shown in FIG. 4, every four pixels in the color-filtering array having the Bayer pattern include the color-filtering film layers for red, green and blue. B refers to the color blue, Gb refers to the color green that lays beside the color blue, R refers to red and Gr refers to the color green beside the color red. In addition, the color-filtering array may further include a plurality of micro-lenses (not shown) disposed thereon. Each micro-lens is disposed over a corresponding color-filtering film layer to increase incident light intensity and improve the sensing quality.

Figure 5:
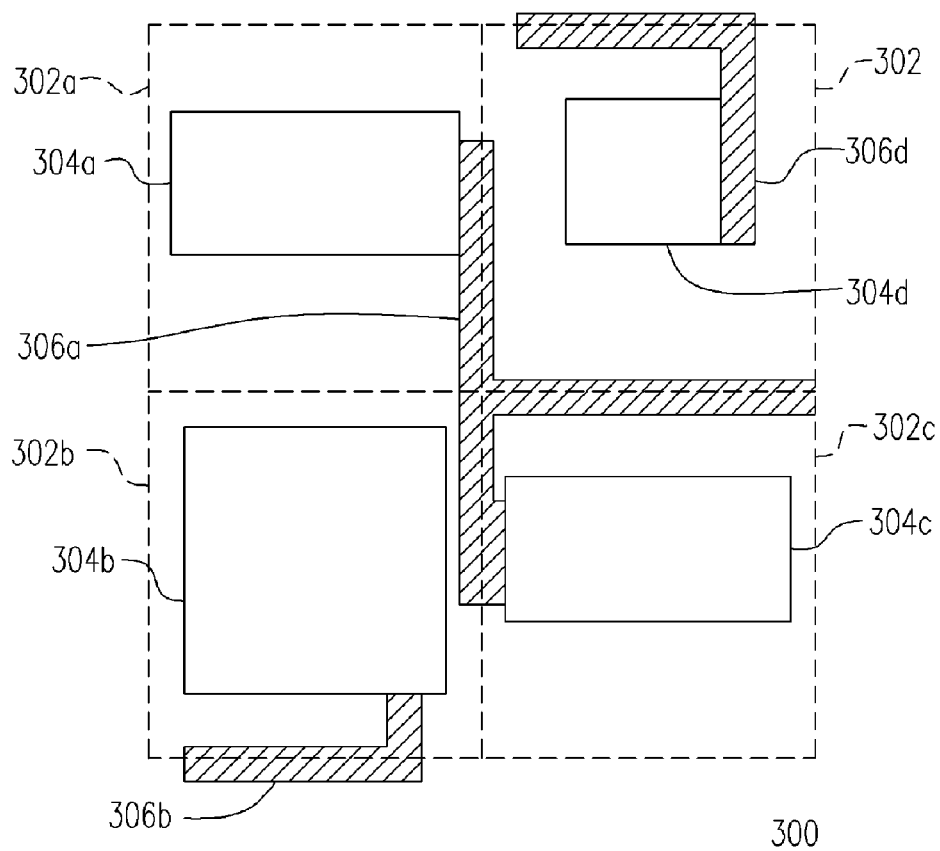
FIG. 5 is a diagram showing a pixel layout in a CMOS image sensor according to another embodiment of the present invention.
Figure 6:
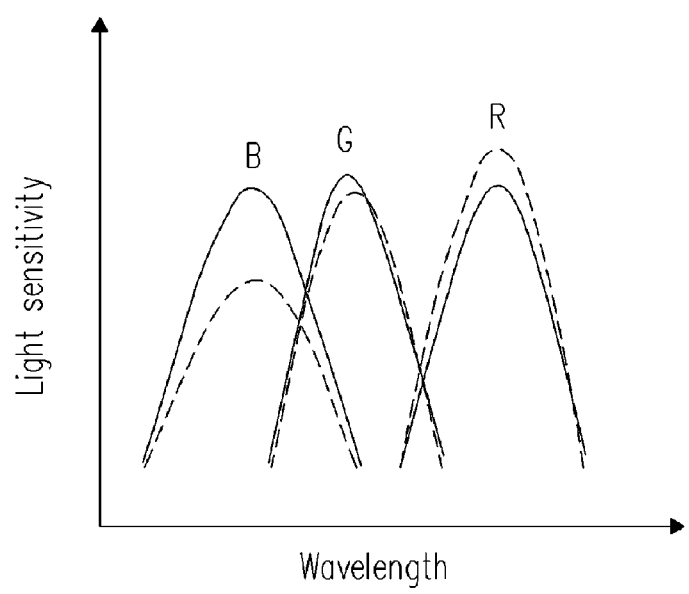
FIG. 6 is a graph showing the sensitivity versus wavelength relation of the CMOS image sensor in the present invention with respect to red light, green light and blue light.

FIG. 5 is a diagram showing a pixel layout in a CMOS image sensor according to another embodiment of the present invention. In one embodiment as shown in FIG. 5, the size of the light sensing regions 304 within various pixels 302 are assigned such that the light sensing region 304b of the blue pixel 302b is greater than the light sensing regions 304a of the green pixel 302a and greater than the light sensing region 304c of the green pixel 302c, and the light sensing regions 304a of the green pixel 302a and the light sensing region 304c of the green pixel 302c are both greater than the light sensing region 304d of the red pixel 302d. Therefore, the filler factor of the blue pixel 302b is greater than the filler factor of both the green pixels 302a, 302c and the red pixel 302d. Furthermore, compared with the conventional CMOS image sensor, the light sensing region 304b of the blue pixel 302b occupies an area greater than the conventional light sensing region and the light sensing region of the red pixel 302d occupies an area smaller than the conventional light sensing region, while each of the light sensing regions 304a, 304c of the green pixels 302a, 302c occupies an area identical to the conventional light sensing region. In the sensitivity/wavelength graph (shown in FIG. 6), the sensing capacity of the CMOS image sensor for blue light is stronger than a conventional CMOS image sensor while the sensing capacity of the CMOS image sensor for red light is weaker than a convention CMOS image sensor. Meanwhile, the sensing capacity of the CMOS image sensor for green light is identical to a conventional CMOS image sensor. In other words, the pixels in the CMOS image sensor according to the present invention have comparable sensing capacity for green light, red light and blue light. Furthermore, the two green pixels 302a, 302c may use a common active device region 306a (as shown in FIG. 5) to increase the filler factor and enhance light sensitivity.

Obviously, the filler factor in different pixels can be adjusted according to actual conditions and processing requirements instead of the one described in the present invention.

In summary, the present invention utilizes the change in the dimensions of the light sensing region within a pixel to increase the filler factor and enhance the response to blue light. In other words, the light sensing capacity for blue light is enhanced without changing the area layout of the pixel. Because the size of the pixels remains unchanged, there is no increase in the occupying area of the devices or the cost of fabricating the wafer and lenses.

Furthermore, the only modification is the layout design in the beginning. All subsequent processing steps are identical to the conventional method. Thus, the sensitivity of the device can be increased with very little changes in the fabrication process. The inventon doesn't have the questions of more complicated for the process, and disadvantageous for the production mentioned by the prior art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A complementary metal oxide semiconductor (CMOS) image sensor layout structure, comprising:
   a substrate having a pixel array region thereon, wherein the pixel array region comprises a plurality of pixels each having a light sensing region and an active device region, the pixels are isolated from one another by isolation structures and the light sensing regions have different sizes;
   a plurality of light sensing devices defined separately within each light sensing region;
   a plurality of transistors disposed inside each active device region; and
   a plurality of color-filtering film layers disposed separately above corresponding pixels to form a color-filtering array (CFA).

2. The CMOS image sensor layout structure of claim 1, wherein the size of each pixel is equivalent.

3. The CMOS image sensor layout structure of claim 1, wherein the color-filtering array is organized into a Bayer patter, the Bayer pattern comprising:
   a first color and a second color repeatedly disposed in the odd column of the color-filtering array; and
   a third color and the first color repeatedly disposed in the even column of the color filtering array.

4. The CMOS image sensor layout structure of claim 3, wherein the first color is green, the second color is red and the third color is blue.

5. The CMOS image sensor layout structure of claim 4, wherein every group of four pixels comprises a red pixel, two green pixels and a blue pixel.

6. The CMOS image sensor layout structure of claim 5, wherein the size of the light sensing region within each pixel is arranged such that the light sensing region of the blue pixel is greater than the light sensing region of the green pixel and the light sensing region of the green pixel is greater than the light sensing region of the red pixel.

7. The CMOS image sensor layout structure of claim 6, wherein the two green pixels use a common active device region.

8. The CMOS image sensor layout structure of claim 1, wherein the light sensing device comprising a photodiode.

9. The CMOS image sensor layout structure of claim 1, wherein the CMOS image sensor further comprising a plurality of micro-lenses disposed separately over corresponding color-filtering film layers.

* * * * *